United States Patent [19]
Taylor, Sr.

[11] Patent Number: 4,727,493
[45] Date of Patent: Feb. 23, 1988

[54] INTEGRATED CIRCUIT ARCHITECTURE AND FABRICATION METHOD THEREFOR

[75] Inventor: David L. Taylor, Sr., Monument, Colo.

[73] Assignee: Integrated Logic Systems, Inc., Colorado Springs, Colo.

[21] Appl. No.: 607,250

[22] Filed: May 4, 1984

[51] Int. Cl.$^4$ .............................................. G06F 15/60
[52] U.S. Cl. ................................... 364/490; 364/488; 364/491
[58] Field of Search ..................... 364/488–491; 307/468; 357/45, 46

[56] References Cited

U.S. PATENT DOCUMENTS

| | | | |
|---|---|---|---|
| 3,702,004 | 10/1972 | Eskew et al. | 364/489 X |
| 3,849,638 | 11/1974 | Greer | 307/468 X |
| 4,032,894 | 6/1977 | Williams | 307/468 X |
| 4,377,849 | 3/1983 | Finger et al. | 364/491 |
| 4,500,963 | 2/1985 | Smith et al. | 364/488 X |
| 4,518,874 | 5/1985 | Davis et al. | 357/45 X |
| 4,580,228 | 4/1986 | Noto | 364/491 |
| 4,613,940 | 9/1986 | Shenton et al. | 364/488 X |

Primary Examiner—Gary V. Harkcom
Assistant Examiner—H. R. Herndon
Attorney, Agent, or Firm—Timothy J. Martin

[57] ABSTRACT

A new ensemble of logic elements organized in an array and a method of forming the same wherein the architecture includes a main field of transistor elements formed on a substrate material. A group of load transistors and an array of logic gates are formed on the substrate and are located within the main field of transistors. At least one routing channel is provided in the main field, and an input/output structure is located on the substrate. A region of flip-flop elements, also located within the main field, may be provided. Preferably, a plurality of such groups, arrays and regions are formed in parallel strips extending across the main field, and a perpendicular bussing channel also extends across the field to divide the main field into component arrays. The logic gates may be configurable structures or dedicated inverters, and a plurality of input/output structures may be employed. The method includes the electrical interconnection of these elements into logic terms to form an integrated circuit.

24 Claims, 11 Drawing Figures

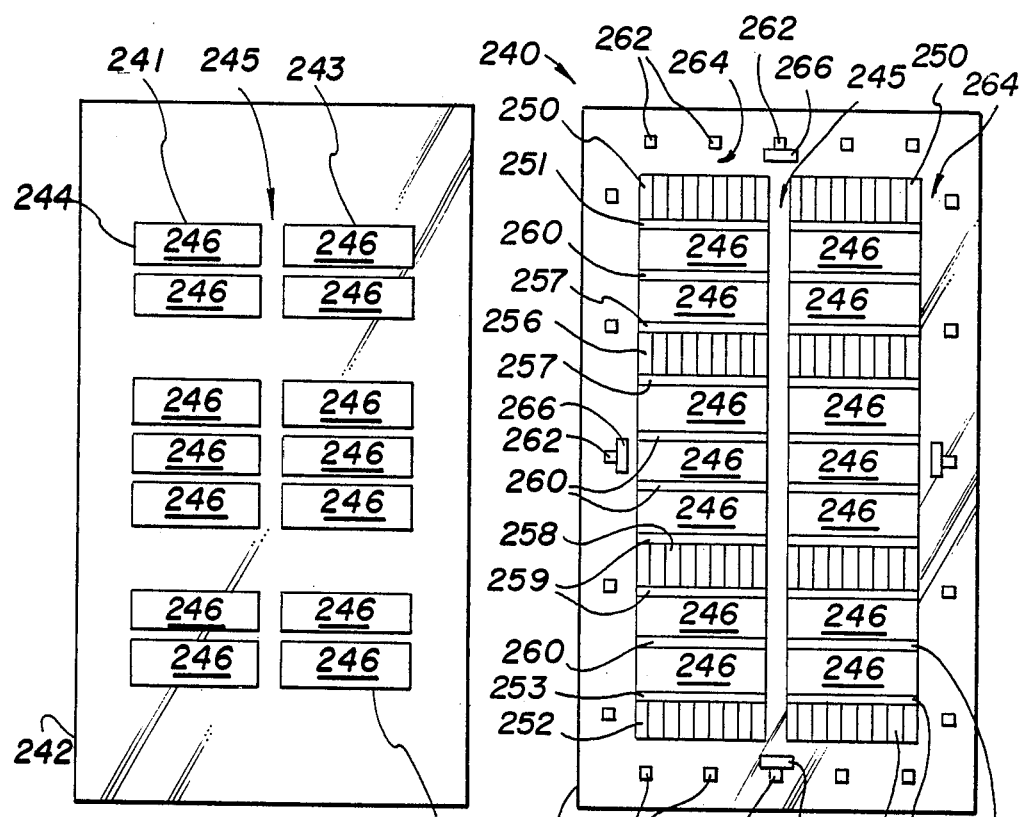
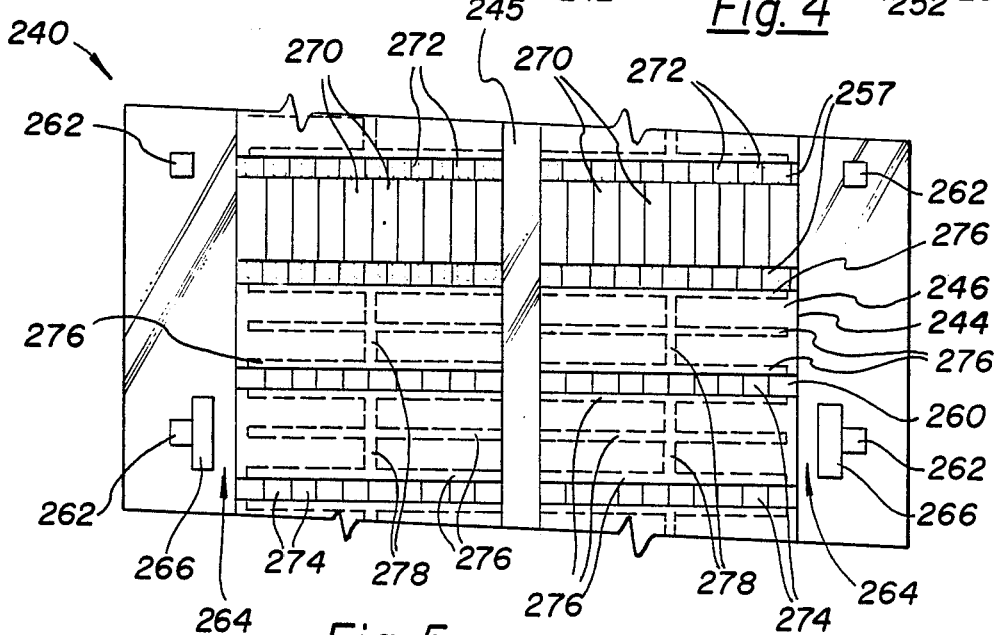
Fig. 6
Fig. 4
Fig. 5

INTEGRATED CIRCUIT ARCHITECTURE AND FABRICATION METHOD THEREFOR

BACKGROUND OF THE INVENTION

The last few years have witnessed tremendous advancements in the field of integrated circuit technology. In its infancy, integrated circuit technology permitted fabrication of several discreet transistor elements on a single wafer of silicon material. In recent years, though, improvements in fabrication technology have permitted integrated circuits to become so dense that a single chip may contain thousands of transistor cell elements. An important feature of large-scale integrated circuits is the circuit "architecture" which is the organized structure of the circuit elements. The present invention relates to an improved architecture for configurable large scale and very large-scale integrated circuits.

Integrated circuit technology is broadly divided into two fields, the standard circuit field and the custom circuit field. In the field of standard circuits, a consumer merely purchases a pre-designed integrated circuit that is already "wired" to perform a selected function. In the field of custom circuits, the consumer determines his own logic designs and the fabricator implements that logic design as a circuit formed of logic elements formed generally on a silicon wafer according to the fabrication technique utilized by the particular fabricator. The field of custom integrated circuits includes both fully-customized circuits and semi-customized circuits. For semi-custom circuits, the consumer provides the fabricator with a logic description corresponding to his circuit requirements that enables the fabricator to determine a "wiring pattern." The fabricator then takes a chip organized with the fabricator's architecture and interconnects the elements in that architecture to form the customized circuit. While the present invention is particularly adaptable for use in semi-custom applications, the present chip architecture is completely suitable for standard circuits as well.

Chip fabricators employ three common approaches in the field of semi-custom circuit design. In a first one of these approaches, fabricators employ gate arrays that are organized in a uniform manner so that the customer merely supplies his logic requirements, and the fabricator determines the interconnect data. In the gate array technique, columns of cell elements are fabricated on a substrate with each of these cell elements comprising an unconnected plurality of both n channel and p channel transistor elements. Interconnects are then made among the transistor elements in each cell and among the cell elements to each other so that the gate array is "wired" to perform a desired logic function. Areas between the columns of cell elements provide routing or "wiring" channels to allow the interconnects between cell elements to be made.

A second technique commonly used employs standard cells which may be fabricated on a substrate. Here, the customer selects among standard cell elements, for example, AND gates, OR gates, NAND gates, and NOR gates which are already interconnected; these standard cell elements are internally preprogrammed with their own interconnects. Once the user selects the desired cells and provides the cell-to-cell interconnect data, the fabricator then fabricates the desired standard cells on the substrate and wires the standard cells together to provide the desired logic circuit. These standard cells are also commonly organized as columns of cell elements on the substrate material.

The third technique utilized in the field of semicustom chip fabrication is referred to as programmable logic arrays or PLA technology. While in some respects the PLA chip organization is the closest of the three techniques to the present invention, the chip architecture for a PLA is quite different from that described in the present invention. In PLA architecture, a first matrix of transistor elements defines a field of AND terms and a second, continguous matrix of transistors defines a field of OR terms. Rows of transistors in the AND field may be interconnected to columns of transistors in the OR field by interconnects, such as metal strips, extending completely across the two contiguous fields. Linear input interconnects extend across the rows of the AND field and continue across the columns of the OR field with these interconnects providing inputs to the PLA. Linear output interconnects also extend across the rows of transistors in the OR field perpendicular to the input interconnects and provide outputs for the PLA. A strip of nonconfigurable logic structures, such as flip flop elements, is provided adjacent the OR field so that the output interconnects extend across the logic structures as well. In PLA technology, the gates of each transistor element may be selectively interconnected to its respective input interconnect or output interconnect, and the output interconnects may be connected, where desired, to the logic structures so that the logic array performs a desired logic function.

While PLA devices perhaps provide the most straightforward approach to forming large-scale and very large-scale integrated circuits, there is a very undesireable consequence of this approach when more and more transistors are desired to be incorporated into the logic array. Specifically, as the number of gates or transistors increases, the chip size grows enormously. More particularly, during fabrication a number of individual chips are fabricated simultaneously on a larger, usually disk-shaped wafer. The individual chips are then cut apart of "diced" from one another for subsequent packaging. In the fabrication process, though, defects randomly occur across the silicon wafer. Since a defect occurring in a given chip typically ruins that chip, only those chips having virtually no defects are useable. As the size of the individual chip grows to accommodate more and more transistor elements, fewer chips may be diced from a given size wafer and the chances that a single chip will contain one of the wafer's defects increases exponentially. Accordingly, as the power of the logic array increases, its cost is greatly increased due to the lower dice yield that is achieved. This dimension problem is also true for standard cells and gate arrays.

Accordingly, there is a need for an improved chip architecture that permits higher gate count devices yet which allows the physical dimensions of the chip to remain smaller. It is further desireable to have an improved architecture that provides both the advantages of low circuit development costs resulting from the use of a predefined chip architecture and lower device costs resulting from the smaller chip size.

SUMMARY OF THE INVENTION

It is an object of the present invention to provide a new and useful chip architecture that may be employed as a predefined architecture in the fabrication of large and very large-scale integrated circuits.

Another object of the present invention is to provide a chip architecture that relatively decreases the number of required transistor elements in a logic array so as to minimize the physical size of an integrated circuit chip.

It is a further object of the present invention to provide a chip architecture that orients the assorted logic elements of an integrated circuit in contiguous strip-shaped bands so as to minimize the area necessary for routing channels enabling mutual interconnection.

A still further object of the present invention is to provide a new and useful method for forming large and very large-scale integrated circuits so as to increase the density of useful logic devices therein.

The present invention, then, comprises a new structural organization of transistor elements and logic structures in large or very large-scale integrated circuits, as well as a method for forming such circuits with this new architecture. This architecture includes a main field of transistor elements in the form of a matrix array which transistors are adapted for electrical interconnection in order to perform a desired logic function. Groups of load transistors are interspersed in the main field to define inputs for the logic terms formed out of the transistor elements. A plurality of arrays of logic gates which are adapted to be configured into logic structures are also interspersed within the main field. Flip-flop regions comprised of flip-flop elements may also be interspersed in the main field.

More specifically, one embodiment of the present invention comprises an array architecture that is structured in a rectangular format with the main field being separated into a plurality of component arrays by strip-shaped flip-flop regions, strip-shaped logic arrays and strip-shaped groups of load transistors. Each component array is defined by an m-row n-column matrix of transistor elements where m and n are integers of selected variable magnitude. The flip-flop regions are defined by strip-wise oriented groups of dedicated, configurable flip-flop elements which have groups of logic structures associated therewith. For example, a logic array may be provided on each side of the flip-flop region and is either spaced closely thereto or positioned contiguously with a flip-flop region. In this manner, the flip-flop regions are separated from the component arrays by the logic arrays. These logic arrays are preferably constructed as arrays of configurable logic gates in a strip-wise fashion, and, for example, may be strips of inverter elements. These logic structures may also be adapted for use as configurable, random logic.

Additional logic arrays may be physically interspersed at desired locations within one or more of the component arrays. Input and output structures are placed around this set of logic arrays, flip-flop regions and component arrays in order to introduce and read electrical signals processed by the integrated circuit formed by the interconnected architecture elements. Routing channels may be provided between the transistor arrays and flip-flop and between the set of arrays and the input/output structures so as to provide regions for electrically interconnecting the components of the integrated circuit. The input/output structures may also be connected to the array elements through input/output buffers in order to drive the heavy capacitance loads associated with the inputs/outputs.

It should thus be appreciated that a method of forming large-scale and very large-scale integrated circuits is contemplated by the present invention. This method includes the fabricating of transistor elements, load transistors, logic gate structures and input/output structures on a substrate such that the transistor elements define a main field, the load transistors define at least one load transistor group located in the main field, and the logic gates define at least one logic array located in the main field; the input/output structures are physically spaced from the main field. Preferably several distinct groups of load transistors and several distinct groups of logic arrays are formed. During the step of fabricating the transistor elements, routing channels are provided between the arrays and elements comprising the main field and between the input/output structures and the main field for permitting formation of interconnect structures therealong. This method also contemplates fabricating flip-flop elements on the substrate with the flip-flop elements being organized in flip-flop regions located within the main field.

In order to form the integrated circuits, the transistor elements, the load transistors, the flip-flop elements and the logic gate structures are electrically interconnected along selected routing channels to articulate selected logic terms adapted to perform a desired logic function. Finally, the method includes the step of electrically interconnecting selected ones of the input/output structures to selected ones of the transistor elements, flip-flop elements and logic gate structures along the routing channels so that a completed integrated circuit may be formed.

These and other objects of the present invention will become more readily appreciated and understood from a consideration of the following detailed description of the preferred embodiment when taken together the accompanying drawings, in which:

BRIEF DESCRIPTION OF THE DRAWINGS

FIG. 4 is a top plan view of another embodiment of the architecture according to the present invention;

FIG. 5 is a top plan view of an enlarged partial section of FIG. 4;

FIG. 6 is a top plan view showing the main field of transistor elements according to the embodiment of the present invention shown in FIG. 4;

DETAILED DESCRIPTION OF THE PREFERRED EMBODIMENT

The present invention relates to a novel and useful structural organization of transistors and logic elements on a substrate so as to define a chip architecture for a large or very large-scale integrated circuit. Accordingly, the present invention contemplates a method for fabricating this structure as well as the structure itself.

With respect to all of the figures shown herein, it should be appreciated that they are representative of an integrated circuit chip as would be understood by one ordinarily skilled in the art. These figures are presented in representative form since an actual chip contains several thousand transistor and logic devices manufactured through a photographic process.

Figures 1, 2:
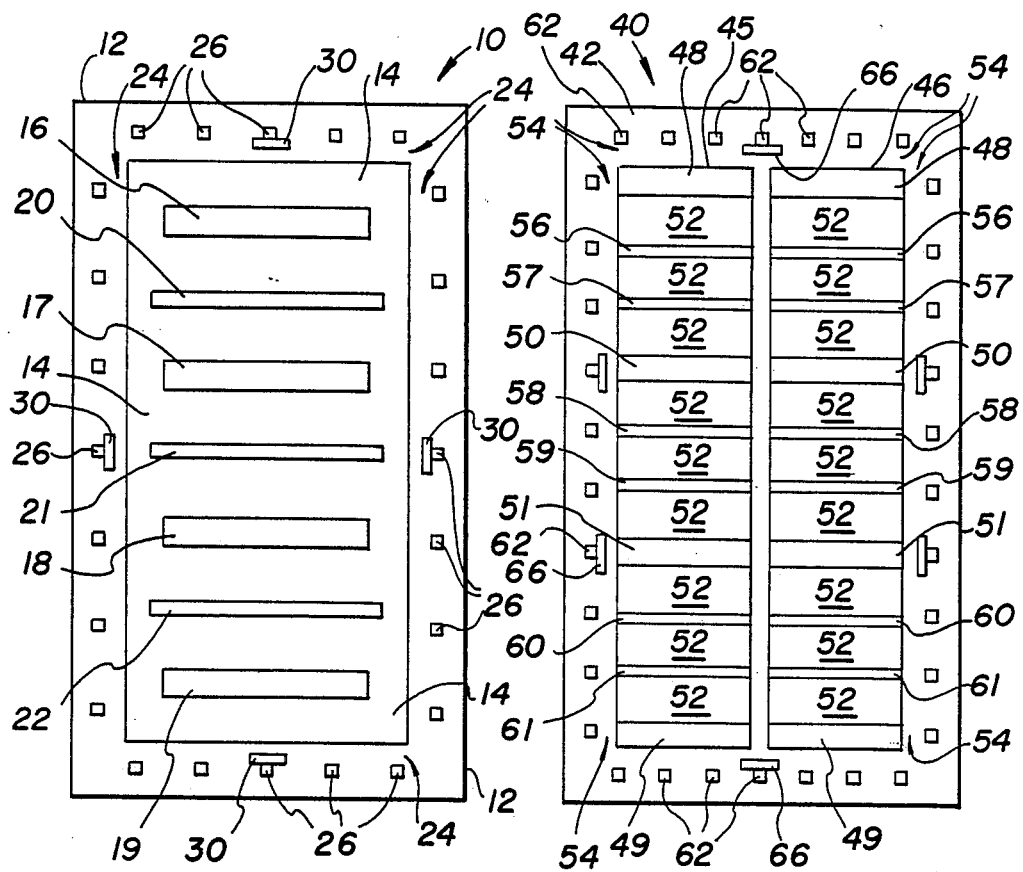
FIG. 1 is a top plan view showing, in representative form, the generalized form of the preferred embodiment of the present invention.
FIG. 2 is a top plan view showing the preferred form of the architecture according to the present invention.

The most generalized form of the present invention is shown in FIG. 1 wherein integrated circuit chip 10 is shown fabricated on a substrate 12, which is usually a rectangular dice cut from a larger silicon or other semiconductor wafer. This ensemble of logic elements comprises a large main field 14 of transistor elements which are interconnected to one another to form logic terms. It should be appreciated that several thousand transistor elements may comprise main field 14 so that no individual transistor elements are shown. Typically, the transistor elements which make up main field 14 may be MOSFET transistors. Thus, it is understood that the MOSFET transistors are either p type or n type channel transistors that act as microswitches for a logic circuit. With the exception of the flip-flop and load transistor regions, described more fully below, main field 14 generally comprises a matrix of these transistor elements formed as an m-row n-column matrix where m and n are positive integers.

A plurality of flip-flop regions, such as flip-flop regions 16, 17, 18 and 19, are formed on substrate 12 and are interspersed within main field 14. Each of flip-flop regions 16, 17, 18 and 19 are defined by a plurality of flip-flop elements that are adapted for interconnection with the other circuit elements forming chip 10. Again, it should be appreciated that these flip-flop elements are extremely small so that the individual flip-flop elements are not shown in FIG. 1. Also interspersed within main field 14 is a plurality of load transistor groups such as groups 20, 21 and 22. Each of load transistor groups 20, 21 and 22 are defined by a plurality of load transistor elements which also may be interconnected to the other elements that form the integrated circuit on chip 10. The load transistors defining groups 20, 21 and 22 are connectable to the transistor elements defining main field 14 in order to form logic gates.

A plurality of input/output structures 26 are organized around the perimeter of main field 14 so that routing channels 24 extend around the perimeter of main field 14 between structures 26 and field 14. Selected ones of input/output structures 26 may include buffer structures 30, and it should be understood that a buffer structure 30 could be provided for each of the input/output structures 26, as desired. Additional routing channels may be provided in the main field 14 of transistor elements.

In the fabrication of an integrated circuit on substrate 12, selected groups of the transistor elements that form main field 14 are locally interconnected to form desired logic terms in a manner similar to that described with respect to the programmable logic array as found in the prior art and described below. It should be appreciated that the main field 14 defines an array that may be electrically interconnected to implement large numbers of AND and OR terms in combinatorial logic functions.

While it should be appreciated that the generalized embodiment of the preferred form of the present invention as shown in FIG. 1 discloses a rectangular-shaped main field 14 and various flip-flop regions and load transistor groups being formed also as strip-shaped, rectangular regions, this shape is not a requirement of the present invention. Thus, it should be understood that main field 14 may take any general amorphous shape on substrate 12. Further, the flip-flop regions, such as regions 16, 17, 18 and 19, may take any amorphous shape as may load transistor groups 20, 21 and 22. In actual fabrication, though, the rectangular format is preferable. It should also be understood that the electrical interconnects which "wire" the transistor elements, the flip-flop elements, the load transistors, the input-/output structures and the buffer structures to one another are not shown in FIG. 1, but are provided by metal deposits placed across and connected to the elements and in the routing channels during the fabrication process. Hence, it should be appreciated that, for an operational integrated circuit to be formed, the elements are wired together by interconnects as is known in the art. It should be further apprciated that the present invention has the advantages of low chip cost since there is a standardized architecture and low circuit development since only required interconnect data needs to be generated to establish the logic circuit.

Figure 3:
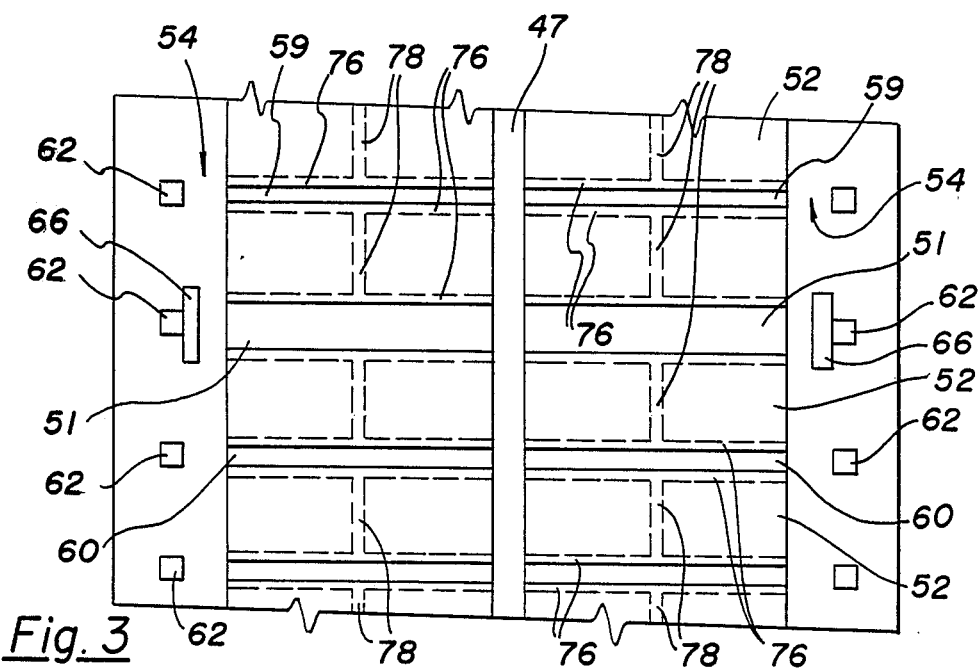
FIG. 3 is a top plan view of an enlarged partial section of FIG. 2.

The preferred form of the present invention is shown in greater detail in FIGS. 2 and 3. In FIGS. 2 and 3, it should be appreciated that flip-flop regions and load transistor groups are each formed in a strip-wise manner extending generally across the main field of transistor elements that implement the logic terms, such as AND terms and OR terms, in the combinatorial logic functions. Here, chip 40 comprises a large or very large-scale integrated circuit that is formed on a substrate 42. A main field 44 of transistor elements is fabricated on substrate 42, but is divided into two sections 45 and 46 by a power bussing channel 47 extending longitudinally across chip 40 at a mid-portion thereof; naturally more than one bussing channel could be provided. A first pair of flip-flop regions 48 extends across the ends of main field sections 45 and 46, and a second pair of flip-flop regions 49 extend across the other edges of main field sections 45 and 46. A third pair of flip-flop regions 51 and a fourth pair of flip-flop regions 51 extend across a mid-portion of sections 45 and 46. Load transistor groups 56, 57, 58, 59, 60 and 61 also extend across main field 44 by extending across sections 45 and 46.

Flip-flop regions 48–51 and transistor groups 56–61 are all formed as rectangular strips that extend transversely across chip 40. Thus, regions 48–51 and groups 56–61 extend perpendicularly to bussing channel 47 between channel 47 and a routing channel 54, discussed below. Flip-flop regions 48–51 and transistor groups 56–61, along with bussing channel 47, divide main field 44 of transistor elements into a plurality of component transistor arrays 52. Each of component arrays 52 preferably comprises a matrix of transistor elements having m rows and n columns where m and n are positive integers, although it is not necessary for each component array to have the same number of rows and columns. A plurality of input/output structures 62 are positioned in spaced apart relation to main field 44 around the perimeter thereof so that routing channels 54 are formed between input/output structures 62 and main field 44. Buffer structures 66 may be provided on selected ones of input/output structures 62, as described above with respect to FIG. 1.

In FIG. 3, a portion of chip 40 is shown enlarged so that greater detail is evident with respect to flip-flop regions, the load transistor groups and the component arrays. In FIG. 3, it may be seen that additional routing channels, such as transverse routing channels 76 and longitudinal routing channels 78 are provided within component arrays 52. Routing channels 76 and 78 are shown in phantom within component arrays 52, and it should be understood that these routing channels are areas where component arrays 52 be devoid of transistor elements so that metal, polycrystal or diffusion interconnects extend therealong. It should also be understood that, in fabrication, transistor elements may be actually located in routing channels 76 and 78 but are inaccessible when a metal interconnect routing is placed across the top of these transistor elements so that they are unuseable. It should be further understood that, in addition to the flip-flop regions and the load transistor groups described above, a typical integrated circuit formed on chip 40 requires additional logic gate structures, such as inverters, latches and the like. Separate, non-configurable inverters may be provided alongside flip-flop regions 48-51 or within main field 44, but, in the alternative inverters may be constructed out of selected ones of the transistors making up the main field 44. In the later case, no separate inverter elements are required.

From the above description, it should now be appreciated that the method of the preferred embodiment of the present invention comprises the steps of fabricating transistor elements, logic gates, load transistors and input/output structures on a substrate material utilizing existing fabrication technology. Flip-flop elements may also be fabricated during this step. When the fabrication step is performed, the transistor elements define in main field with the flip-flop elements forming flip-flop regions interspersed in the main field and with the load transistor groups also interspersed in the main field; the input/output structures are spaced apart from the main field. Preferably, the logic gates are arranged in strip-shaped arrays; the load transistors are arranged in strip-shaped groups; and the flip-flop elements are arranged in strip-shaped regions. All of these strip-shaped structures are preferably fabricated in a generally parallel relationship to one another. Some of the logic arrays may be positioned adjacent selected flip-flop regions. A further step of providing routing channels in the main field and between the input/output structures and the main field permits formation of interconnect structures therealong. A bussing channel may be formed during the fabrication of the circuit elements with the bussing channel extending across the main field perpendicularly to the strip-shaped structures. As part of the fabrication step, logic structures, for example inverters, may be created along with the other semi-conductor elements, such as the transistors and flip-flops.

To form the integrated circuit, the preferred method includes the step of electrically interconnecting the transistor elements, the flip-flop elements and the load transistors along with logic gates to form selected logic terms operative to perform desired logic functions. The electrical interconnects predominantly occur along selected ones of the routing channels. To this end, some of the logic gates may be formed as dedicated inverter elements. The configurable gates are configured into selected logic structures during the electrical interconnect stage. Finally, the input/output structures are electrically interconnected to selected ones of the transistor elements, flip-flop elements, load transistors and logic gates along routing channels so that a complete device is formed.

It should be appreciated that the electrical interconnection steps usually occur by placing two layers of metal over the semiconductor fields and arrays in a pair of sequential steps utilizing mask technology as is known in the art although other interconnects may be employed. Indeed, the fabrication of large-scale and very large-scale integrated circuits according to the structure and method of the preferred embodiment of the present invention usually takes place through a series of masks so that the substrate material is doped at desired minute locations and is provided with various layers of metal, oxide and semiconductor materials that may be heat treated to form the integrated circuit. None of the details of this process are described herein since the general steps of fabricating these microcircuits are known in the art and described in printed publications. For example, a basic reference text in this area describing some of the steps Conway and published by the Addison-Wesley Publishing Company, Inc., ISDNO-201-04358-0.

Another embodiment of the present invention is shown in greater detail in FIGS. 4, 5 and 6. In FIGS. 4 and 5, it should be appreciated the logic gate arrays, load transistor groups and flip-flop regions are formed in a strip-wise manner that extend generally across the main field of transistor elements that implement the logic terms in the combinatorial logic functions. Here, chip 240 comprises a large or very large-scale integrated circuits that is formed on substrate 242. A main field 244 of transistor elements is fabricated on substrate 242 and a plurality of strip-shaped flip-flop regions, load transistor groups and logic gate arrays are also fabricated on substrate 242 on either side of a longitudinal power bussing channel 245. Channel 245 divides main field 244 into two field sections 241 and 243.

Specifically, a pair of flip-flop regions 250 and 252 extend across sections 241 and 243 at the ends of main field 244. A pair of strip-shaped logic gate arrays 251 extend across main field 244 and are adjacent with flip-flop region 250. Similarly, a pair of logic gate arrays 253 are strip-shaped and extend beside with flip-flop region 252. A second and third pair of flip-flop regions 256 and 258 are strip-shaped in configuration and extend completely across main field 244. A pair of strip-shaped logic gate arrays 257 extend along flip-flop region 256 on either side thereof, and a pair of logic gate arrays 259 extend beside flip-flop region 258, on either side thereof. Logic gate arrays 251, 253, 257 and 259 are defined by logic structures, preferably in the form of inverter elements. A plurality of load transistor groups 260 are in the form of strips that extend across sections 241 and 243 of main field 244.

Flip-flop regions 256 and 258 with their associated logic gate arrays 257, 259 and 260 in conjunction with load transistor strips 260 and bussing channel 245 divide main field 244 of transistor elements into a plurality of component transistor arrays 246. Each of these component arrays 246 is preferably formed as a matrix having m-rows and n-columns of transistor elements where m and n are positive integers. A plurality of input/output structures 262 extend in spaced apart relation to main field 244 around the perimeter thereof so that routing channels 264 are formed between input/output structures 262 and main field 244. Buffer structures 266 may be provided on selected ones of input/output structures 262, as described above.

In FIG. 5, a portion of chip 240 is shown enlarged so that greater detail is evident with respect to the flip-flop regions, a load transistor group, the logic gate arrays, and the component arrays. In FIG. 5, flip-flop region 256 is shown formed of a plurality of flip-flop elements 270, with each of logic gate arrays 257 preferably being formed by a row of inverter elements 272, with each of logic gate arrays 257 being positioned on either side of flip-flop region 256. A single row of logic structures 274 define array 260. Transverse routing channels 276 and longitudinal routing channels 278 are shown in phantom within component arrays 246. It should be understood that routing channels 276 and 278 are areas where component arrays 246 may be devoid of transistor elements so that metal interconnects may extend there-along.

FIG. 6 shows main field 244 being separated into its sections 241 and 243 and being composed of component arrays 246. The transistor elements that make up field 244 may either be p-channel or n-channel devices. These transistors are interconnectable to perform desired logic terms with different interconnects allowing different terms to be constructed. Thus, a customer need only to define his logic circuit, and the fabricator can then supply the interconnects to form the desired intergrated circuit.

Figure 7:
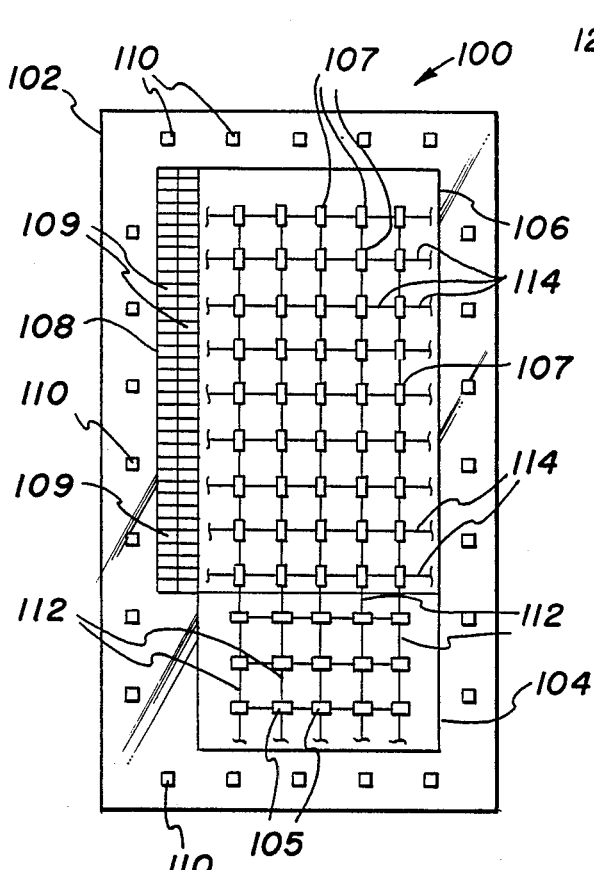
FIG. 7 is a top plan view of a programmable logic array device architecture according to the prior art.

To understand how the preferred embodiment of the present invention departs from existing chip architecture, FIGS. 7–11 show three forms of existing technology. In FIG. 7, the standard architecture for a programmable logic array, or PLA, is shown along with representative metal interconnects. More particularly, PLA 100 is formed on a substrate 102 and includes AND array 104 and OR array 106. AND array 104 is formed as a matrix of transistor elements 105 that are in an r-row s-column matrix, where r and s are positive integers. OR array 106 is defined by a t-row v-column matrix of transistor elements 107, where t and v are positive integers. Typically, the number of columns of transistor elements 107 correspond to the number of rows of transistor elements 105. It should further be understood that the number of transistor elements 105 and 107 shown in FIG. 4 is for representative purposes only and usually are on the order of several thousand. A flip-flop region 108 defined by flip-flop elements 109 extends contiguously with and along the edge of the longitudinal length of OR array 106 but does not extend along AND array 104. A plurality of input/output structures 110 extend around the perimeter of arrays 104, 106 and flip-flop region 108 to provide input/output structure for the logic elements contained therein. These input/output structures 110 may include buffer structures (not shown) as is known in the art.

The manner in which AND array 104 and OR array 106 interact with one another through their metal interconnects may be now more thoroughly appreciated. Representative interconnects 112 are shown extending longitudinally across rows of transistors 105 and columns of transistors 107. A transverse set of interconnects 114 extends across rows of transistor elements 107 and may be inputted into flip-flops 109. In MOSFET technology, transistor elements 105 and 107 are channel devices which have programmable gates or drains, but not both, so that selected ones of the transistors may be connected to the metal interconnects 112, 114 extending thereacross. The connection of the selected gate or drain, as the case may be, thereby allows the fabricator to select the logic term to be implemented.

What should be appreciated from the structure shown in FIG. 7 is that once one of the interconnect lines 112 becomes committed for a row of transistor elements 105 in AND array 104, that line becomes committed for the entire column of transistor elements 107 in OR array 106. If only a relatively small number of transistor elements 105 and 107 are necessary for a desired term with respect to a respective metal interconnect 112, the remaining transistor elements 105, 107 become useless and are wasted insofar as the integrated circuit is concerned. Thus, a large percentage of the transistor elements in AND array 104 and OR array 106 are simply not employed in PLA 100. In order to obtain more utilizable logic terms, the number of transistor elements forming arrays 104, 106 must be increased, which correspondingly increases the size of substrate 102 and therefore makes it more likely to expose the substrate 102 to a defect thereby destroying the fabricated device. Further, it is necessary to employ a clock device with PLA 100 in order to perform successive logic operations of more than one pair of AND/OR terms. The use of a clock in performing operations provides time delay and logical isolation in performing successive logic AND/OR terms thereby slowing the response time of PLA 100.

Figure 8:
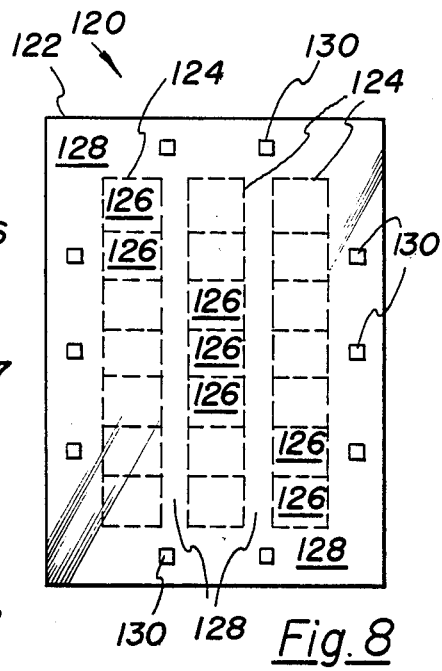
FIG. 8 is a top plan view of a standard cell device architecture according to the prior art.
Figure 9:
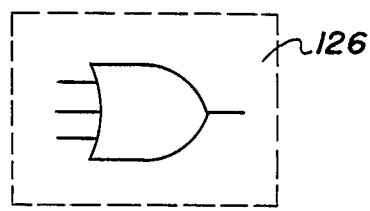
FIG. 9 is a representative view of an example of a cell element of the device shown in FIG. 8.

A second prior art technique is shown in FIGS. 8 and 9. Here, a standard cell device 120 is fabricated on substrate 122. Device 120 includes columns 124 of standardized cells 126 that are separated by routing regions 128 and are surrounded by input/output structures 130. The fabricator selects each logic element 126 from a selected list of standard elements, such as the three input OR gate shown in representative fashion in FIG. 6. With more particularity, the fabricator has available a plurality of standard cell configurations wherein each standard cell will be formed of a plurality of discreet transistors that are enough to form a standard logic term, such as an OR term, AND term, NAND term, NOR term, flip-flop or the like. The fabricator selects the desired elements and they are arranged in columns 124 and necessary metal interconnects are then made between the elements. In this technique, the user simply selects the cells that will form the integrated circuit and the cells are fabricated on the substrate 122 and interconnected to perform the desired logic function. The standard cell structure has the advantage of low chip cost, but has a corresponding disadvantage of high circuit development costs.

Figure 10:
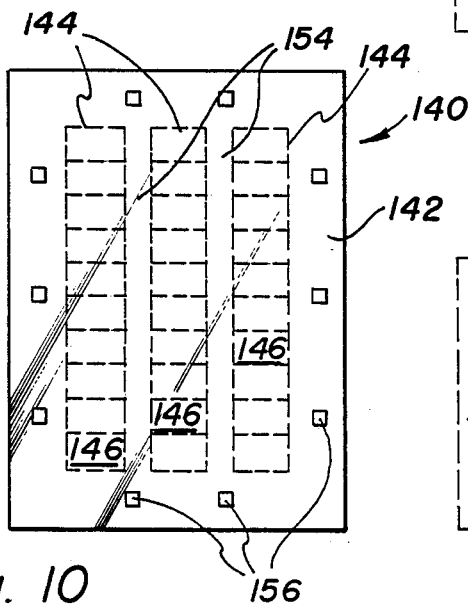
FIG. 10 is a top plan view of a gate array device according to the prior art.
Figure 11:
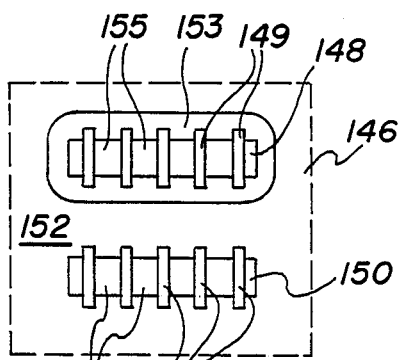
FIG. 11 is a representative view of a cell element of the gate array device architecture shown in FIG. 10.

Finally, a third approach found in the prior art is shown in FIG. 10 and 11, and comprises a gate array 140. Gate array 140 is formed of a plurality off ligic gate elements 146 which are formed in columns 144 on substrate 142. Each logic gate element 146 comprises a first region 148 of n type material within a p type well region 153 and a second region 150 of p type material. Respective transistor gates 149 and 151 are positioned transversely thereacross to form MOSFET devices. The fabricator forms a desired logic term out of one or more of logic gate elements 146 by interconnecting selected transistor gates 149, transistor gates 151 and selected sources 155 and drains 157 and by interconnecting the gate elements 146 to each other. Of course, it should be understood that the electrical roles of sources 155 and drains 157 could be reversed. Input/output structures 156 extend around the set of gate elements and may be provided with buffer structures as is known in the art.

In the gate array technique, such as is shown in FIGS. 10 and 11, the fabricator utilizes only those transistors that are desired to form logic terms to perform the logic function for the integrated circuit. The gate array architecture has the advantage of low circuit development cost and the disadvantage of high chip cost.

Accordingly, the present invention has been described with some degree of particularity directed to the preferred embodiment of the present invention. It should be appreciated, though, that the present invention is defined by the following claims construed in light of the prior art so that modifications or changes may be made to the preferred embodiment of the present invention without departing from the inventive concepts contained herein.

I claim:

1. An ensemble of logic elements formed on a substrate material and organized in an array architecture for use in fabricating large and very large intergrated circuit devices, comprising:

a main field of transistor elements arranged in a matrix on said substrate and electrically connectable in a selected pattern to define logic terms for performing selected logic functions;

a group of load transistors on said substrate at a location within said main field;

a logic array on said substrate at a location within said main field and defined by a plurality of logic gates;

an input/output structure on said substrate; and routing channels on said substrate, some of said routing channels being interspersed in said main field, said routing channels operative to receive electrical interconnects among said main field transistors, said logic gates, said input/output structure and said load transistors to define an intergrtated circuit which peforms a selected logic function.

2. The ensemble according to claim 1 wherein said logic gates are configurable logic circuit elements.

3. The ensemble according to claim 1 including a flip-flop region located within said main field and defined by a plurality of dedicated flip-flop elements.

4. The ensemble according to claim 3 including a plurality of logic arrays and a plurality of flip-flop regions interspersed in said main field, each said logic array being defined by a plurality of logic gates and each said flip-flop region being defined by a plurality of dedicated flip-flop elements.

5. The ensemble according to claim 4 wherein said main field is formed as a rectangular matrix of said transistor elements, each said logic array is formed as a strip of logic gates extending substantially across said main field, each said group is formed as a strip of load transistors extending substantially across said main field and each said flip-flop region is formed as a strip of flip-flop elements extending substantially across said main field.

6. The ensemble according to claim 5 wherein all of said strips extend generally parallel to one another transversely across said main field to separate said main field into a plurality of component arrays each defined by an m-row, n-column matrix of transistor elements, where m and n are positive integers.

7. The ensemble according to claim 4 wherein some of said logic arrays and some of said flip-flop regions are oriented in closely-spaced relation to one another.

8. The ensemble according to claim 7 wherein one of said flip-flop regions has a logic array positioned in closely-spaced relation on each opposite side thereof.

9. The ensemble according to claim 4 wherein one of said logic arrays is positioned contiguously with one of said flip-flop regions.

10. The ensemble according to claim 1 including a bussing channel extending through said main field of transistor elements.

11. The ensemble according to claim 1 including a plurality of input/output structures positioned around said main field and a buffer structure associated with selected ones of said input/output structures.

12. The ensemble according to claim 1 wherein selected ones of said logic gates are inverter elements.

13. An ensemble of logic elements formed on a substrate material and organized in an array architecture for use in fabricating large and very large integrated circuit devices, comprising:

a main field of transistor elements arranged in a matrix on said substrate and electrically connectable in a selected pattern to define logic terms for performing selected logic functions;

a group of load transistors on said substrate at a location within said main field;

a flip-flop region on said substrate at a location within said main field and defined by a plurality of dedicated flip-flop elements;

an input/output structure on said substrate; and routing channels on said substrate, some of said routing channels interspersed in said main field, said routing channels operative to receive electrical interconnects among said main field transistors and said flip-flop elements, said input/output structure and said load transistors to define an integrated circuit which performs a selected logic function.

14. An ensemble of circuit elements formed on a substrate material and organized in an array for use in fabricating large and very large integrated circuit devices, comprising:

a main field of transistor elements formed on said substrate and arranged in a rectangular matrix, said transistor elements being electrically interconnected to define logic terms for performing logic functions;

a plurality of load transistors arranged in strip-shaped groups on said substrate and interspersed in and extending across said main field in generally parallel relation to one another;

a plurality of flip-flop elements arranged in strip-shaped flip-flop regions on said substrate and interspersed in and extending across said main field generally parallel to said load transistor groups;

a plurality of strip-shaped logic arrays defined by configurable logic gates, there being a logic array adjacent each flip-flop region, said logic gates selectively electrically interconnected with said flip-flop elements and said transistor elements;

a bussing channel extending across said main field generally perpendicular to said load transistor groups, said load transistor groups, said flip-flop regions, said logic arrays and said bussing channel separating said main field into ocmponent arrays having m rows and n columns of said transistor elements where m and n are positive integers, said flip-flop elements and said logic gates electively electrically interconnected with one another and with said transistor elements; and a plurality of input/output structures formed on said substrate in spaced relation to said main field and electrically interconnected with selected ones of said transistor elements, said flip-flop elements, said load transistors and said logic gates.

15. The ensemble according to claim 14 wherein said logic gates include dedicated inverter elements.

16. The ensemble according to claim 14 including a plurality of routing channels located within said main field and associated with said component arrays.

17. The ensemble according to claim 16 wherein some of said routing channels are located within selected ones of said component arrays.

18. A method of forming large-scale and very large-scale integrated circuits, comprising the steps of:

fabricating transistor elements, load transistors, logic gates and input/output structures on a substrate material whereby said transistor elements define a main field, said load transistors defining at least one load transistor group located within said main field, and said logic gates defining a logic array located in said main field, said input/output structures spaced from said main field;

providing routing channels in said main field, and between said input/output structures and said main field for permitting formation of interconnect structures therealong; and electrically interconnecting said transistor elements, said load transistors and said logic gates along selected ones of said routing channels to form selected logic terms for performing desired logic functions.

19. The method of claim 18 further including the step of fabricating flip-flop elements on said substrate in a flip-flop region located within said main field.

20. The method of claim 19 including the step of electrically interconnecting selected ones of said input/output structures to selected ones of said transistor elements, load transistors, flip-flop elements and logic gates along selected routing channels.

21. The method of claim 19 wherein a plurality of said load transistor groups, said logic arrays, and flip-flop regions are fabricated on said substrate, each organized in generally parallel strip-shaped structures, some of said logic arrays being located adjacent selected flip-flop regions.

22. The method of claim 21 including the step of providing a bussing channel across said main field and generally perpendicular to said strip-shaped structures.

23. The method of claim 18 wherein some of said logic gates are configurable to form desired logic structures and including the step of configuring said logic gates into selected logic structures by providing selected interconnects therebetween.

24. The method of claim 23 wherein some of said logic gates are dedicated inverter elements.

* * * * *